United States Patent
Parker et al.

(10) Patent No.: US 11,096,844 B2
(45) Date of Patent: Aug. 24, 2021

(54) DRIVE CONTROL SYSTEM FOR POWERED WHEELCHAIR

(71) Applicant: Sunrise Medical (US), LLC., Fresno, CA (US)

(72) Inventors: Andrew Joseph Parker, Lafayette, CO (US); Karl Jozef Chmielowiec, Laredo, TX (US)

(73) Assignee: Sunrise Medical (US) LLC, Fresno, CA (US)

( * ) Notice: Subject to any disclaimer, the term of this patent is extended or adjusted under 35 U.S.C. 154(b) by 0 days.

(21) Appl. No.: 15/514,720

(22) PCT Filed: Sep. 25, 2015

(86) PCT No.: PCT/US2015/052470
§ 371 (c)(1),
(2) Date: Mar. 27, 2017

(87) PCT Pub. No.: WO2016/049583
PCT Pub. Date: Mar. 31, 2016

(65) Prior Publication Data
US 2017/0216115 A1 Aug. 3, 2017

Related U.S. Application Data

(60) Provisional application No. 62/056,246, filed on Sep. 26, 2014, provisional application No. 62/055,100, filed on Sep. 25, 2014.

(51) Int. Cl.
*A61G 5/04* (2013.01)
*A61G 5/10* (2006.01)
(Continued)

(52) U.S. Cl.
CPC ............. *A61G 5/04* (2013.01); *A61G 5/1051* (2016.11); *A61G 5/121* (2016.11); *A61G 5/122* (2016.11);
(Continued)

(58) Field of Classification Search
CPC ........................................................ A61G 5/04
See application file for complete search history.

(56) References Cited

U.S. PATENT DOCUMENTS 4,767,940 A * 8/1988 Tuttle .................. B60L 15/2036
307/116
5,234,066 A * 8/1993 Ahsing .................. A61G 5/045
180/11
(Continued)

FOREIGN PATENT DOCUMENTS

WO WO 0157603 A1 * 8/2001
WO 2014167287 A2 10/2014

OTHER PUBLICATIONS

Google Patents Translated Martinez, WO 2011/025812A1 published in 2011 (https://patents.google.com/patent/WO2011025812A1/en?oq=Wo+2011%2f025812+A1+to+Martinez)(Apr. 11, 2019).*
(Continued)

*Primary Examiner* — Jean Paul Cass
(74) *Attorney, Agent, or Firm* — MacMillan, Sobanski & Todd, LLC

(57) ABSTRACT

A powered wheelchair is operated by sensor-based control pads that include force transducers to produce a variable output signal that is proportional to a varying force applied. The control pad provides an analog-type output that provides a variable speed signal to a controller to operate the wheelchair at a variable speed in both forward/reverse directions and in right or left turning directions.

14 Claims, 7 Drawing Sheets

(51) Int. Cl.
*A61G 5/12* (2006.01)
*H03K 17/955* (2006.01)

(52) U.S. Cl.
CPC ........... *A61G 5/125* (2016.11); *H03K 17/955* (2013.01); *A61G 5/042* (2013.01); *A61G 5/043* (2013.01); *A61G 5/045* (2013.01); *A61G 2203/14* (2013.01); *A61G 2203/18* (2013.01); *A61G 2203/30* (2013.01); *A61G 2203/32* (2013.01); *B60L 2200/34* (2013.01); *B60L 2240/12* (2013.01); *B60L 2250/16* (2013.01); *B60L 2250/22* (2013.01)

(56) References Cited

U.S. PATENT DOCUMENTS

| | | | |
|---|---|---|---|
| 6,926,106 | B2 | 8/2005 | Richey, II et al. |
| 8,388,499 | B1* | 3/2013 | Rindfleisch ...... A63B 23/03533 482/6 |
| 8,761,963 | B2 | 6/2014 | Hinkel, III |
| 8,766,925 | B2 | 7/2014 | Perlin et al. |
| 8,911,019 | B2 | 12/2014 | Josten et al. |
| RE46,069 | E* | 7/2016 | GibsonHorn ........... A61F 5/026 |
| 9,687,983 | B1* | 6/2017 | Prats ........................ B25J 19/04 |
| 2002/0011815 | A1* | 1/2002 | Gaffney .................. B60L 50/52 318/560 |
| 2003/0076067 | A1* | 4/2003 | Ashmore ............... A61G 5/045 318/662 |
| 2004/0147377 | A1* | 7/2004 | Gibson-Horn ............ A61F 5/02 482/105 |
| 2007/0169268 | A1* | 7/2007 | Lemire ................. A61G 7/0509 5/617 |
| 2008/0088472 | A1* | 4/2008 | Beale ...................... G06F 3/017 340/4.12 |
| 2008/0091121 | A1* | 4/2008 | Sun ...................... A61B 5/6826 600/587 |
| 2008/0294300 | A1* | 11/2008 | Ashmore .................. A61F 4/00 700/303 |
| 2010/0045454 | A1* | 2/2010 | Knight ............... G08B 21/0453 340/521 |
| 2010/0331144 | A1* | 12/2010 | Rindfleisch ........ A63B 22/0089 482/6 |
| 2011/0015842 | A1* | 1/2011 | Kume ................... B62B 5/0026 701/67 |
| 2011/0043755 | A1* | 2/2011 | Gibson-Horn .......... A61F 5/026 351/203 |
| 2013/0090779 | A1 | 4/2013 | Pham et al. |
| 2013/0228030 | A1* | 9/2013 | Josten ....................... A61F 4/00 74/480 R |
| 2017/0216115 | A1* | 8/2017 | Parker .................. A61G 5/1051 |
| 2017/0340495 | A1* | 11/2017 | Paul ........................ A61G 5/04 |
| 2018/0021192 | A1* | 1/2018 | Robins ..................... A61G 5/02 180/336 |

OTHER PUBLICATIONS

Extended European Search Report, Application No. 15843875.4, dated May 16, 2018.

* cited by examiner

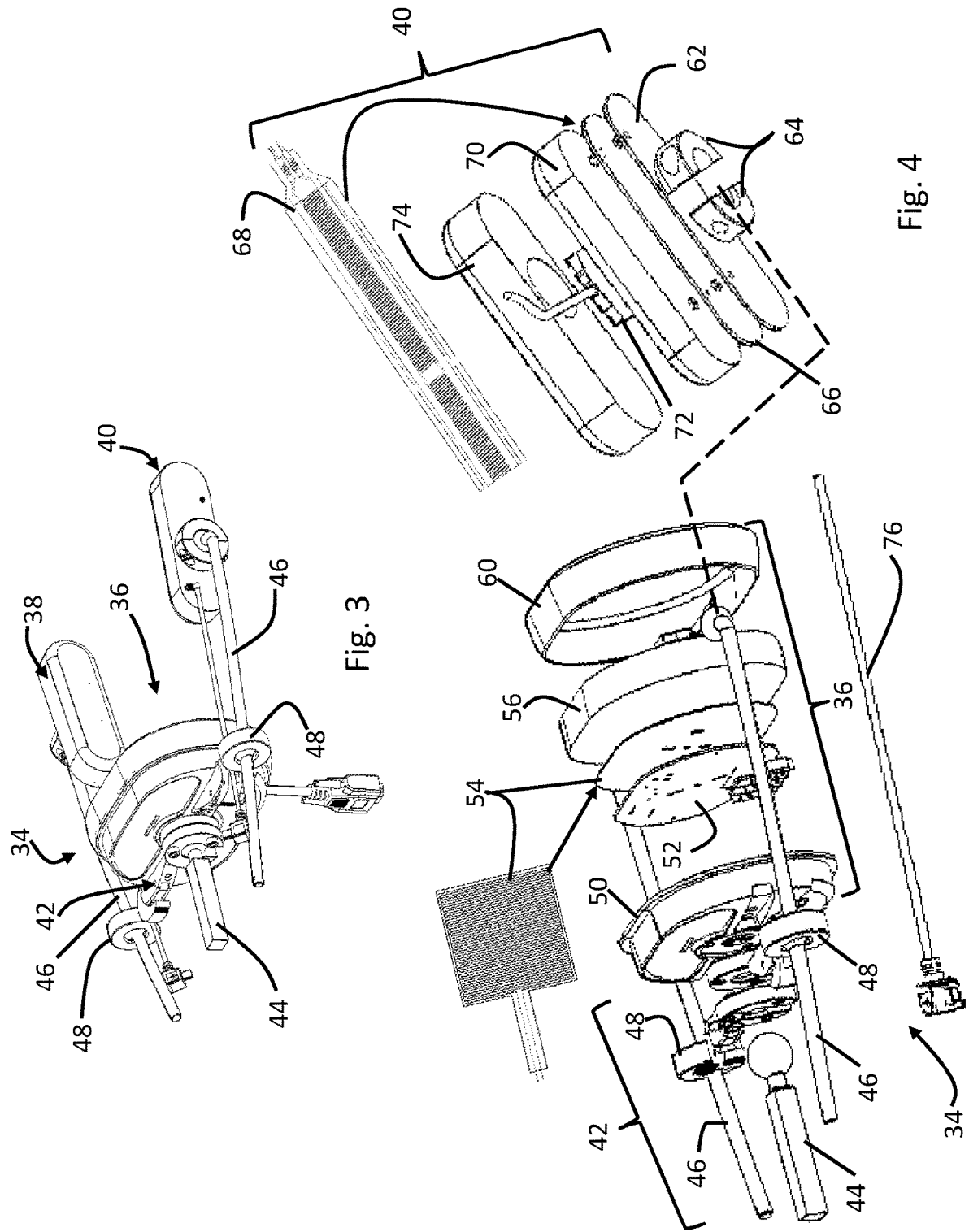

DRIVE CONTROL SYSTEM FOR POWERED WHEELCHAIR

CROSS-REFERENCE TO RELATED APPLICATIONS

This application is the National Phase of International Application PCT/US2015/052470 filed Sep. 25, 2015 which designated the U.S. and that International Application was published in English under PCT Article 21(2) on Mar. 31, 2016 as International Publication Number WO 2016/049583 A1. PCT/US2015/052470 claims priority to U.S. Provisional Application No. 62/055,100, filed Sep. 25, 2014 and U.S. Provisional Application No. 62/056,246, filed Sep. 26, 2014. Thus, the subject nonprovisional application claims priority to U.S. Provisional Application Nos. 62/055,100, filed Sep. 25, 2014 and 62/056,246, filed Sep. 26, 2014. The disclosures of these applications are incorporated herein by reference in their entirety.

BACKGROUND OF THE INVENTION

This invention relates in general to power wheelchairs and, in particular, to control devices for operating a power wheelchair.

Power wheelchairs provide improved mobility to persons having limited ambulatory capacity. In order for the power wheelchair to be effective in improving one's mobility independence, a user must be able to operate and control the speed and direction of the wheelchair. Depending on the level of disability, dexterity, and cognitive capability, various input devices are used to provide desired commands to the controller for operation of the unit. The joystick input device is a general input device having a control stalk that translate forward and backward movement of the stalk to forward and backward movement of the chair and sideway motion to turn commands. This input device is common and relies on a higher level of dexterity and ability in order for the user to properly control the wheelchair.

For users having severely limited or nonexistent use of their hands, a sip-and-puff input device permits control of the wheelchair by pressure or vacuum signals activated by a user's mouth. The sip-and-puff input devices generally provide a step function type of input that lacks the analog-type control capability of the joystick. Thus, control of the wheelchair may be less fluid and comfortable for the user. This is a particularly problematic condition since these users have a very limited range of motion and no physical reaction capability to jerky or abrupt control movements. Thus, it would be desirable to provide an input device that can provide an analog-type of input which varies in intensity of control; i.e., increases or decreases in speed and/or direction; similar to a joystick input device.

SUMMARY OF THE INVENTION

This invention relates to an analog-type input device for control of a power wheelchair that provides a continuously proportional input signal in response to contact and pressure commands from areas of a user's head. Alternatively, other areas or appendages, such as a user's neck and chin, the palm and backside of a user's hand, and a user's arm may actuate the sensor arrays.

This invention relates to a powered wheelchair drive control system having a head array and a controller. The head array has at least one pad having at least one of a force sensor proportionally responsive to an applied force from a user's head against the at least one pad and a capacitive sensor responsive to the proximity of a user's head relative to the at least one pad. The controller operates a wheelchair drive motor in response to signals generated by the at least one force sensor and capacitive sensor activated by a user's head.

In another aspect of the invention, the capacitive sensor of the powered wheelchair drive control system provides an active state signal in response to the presence of the user's head and an off state signal in the absence of the user's head. The controller is programmed to operate a wheelchair drive motor at a predetermined speed level in response to the capacitive sensor generating an active state signal.

In yet another aspect of the invention, the head array includes left, right and center pads, where each pad includes a force sensor in addition to capacitive sensors. The controller is programmed to be responsive to the capacitive sensor in the center pad to activate a predetermined speed range in one of a forward and a reverse direction. The force sensor generates a proportional speed signal in the one of the forward and reverse directions within the predetermined speed range.

In yet another aspect of the invention, the controller responds to the capacitive sensor in the left pad to activate a left turn direction and a predetermined left rate of turn and responds to the capacitive sensor in the right pad to activate a right turn direction and predetermined right rate of turn. The controller may be programmed with the predetermined forward speed range and the predetermined left rate of turn and the predetermined right rate of turn and further programmed to adjust a force parameter associated with the force sensor. The controller may also be programmed to capture an output value of at least one of the left, right, and center force sensors in response to an initial active state signal from the corresponding left, right, and center capacitive sensor. In certain embodiments, the controller is programmed to equate the output value of the force sensor to a threshold value such that the controller responds to force output signals from the one of the left, right and center force sensors that is above the threshold value.

In another aspect of the invention, the controller responds to the capacitive sensor in the left pad to activate a left turn direction and a predetermined left rate of turn and responds to the capacitive sensor in the right pad to activate a right turn direction and predetermined right rate of turn. The controller may also include an algorithm having a transfer function that limits the proportional output of the force sensor to a range between one of the predetermined forward speed range, the predetermined left rate of turn and the predetermined right rate of turn and a corresponding maximum forward speed, maximum left rate of turn, and a maximum right rate of turn.

Various aspects of this invention will become apparent to those skilled in the art from the following detailed description of the preferred embodiment, when read in light of the accompanying drawings.

BRIEF DESCRIPTION OF THE DRAWINGS

FIG. 3 is a perspective view of another embodiment of a head array assembly having alternative adjustment capability.

FIG. 4 is an exploded view of the head array of FIG. 3.

DETAILED DESCRIPTION OF THE PREFERRED EMBODIMENT

Figure 2:
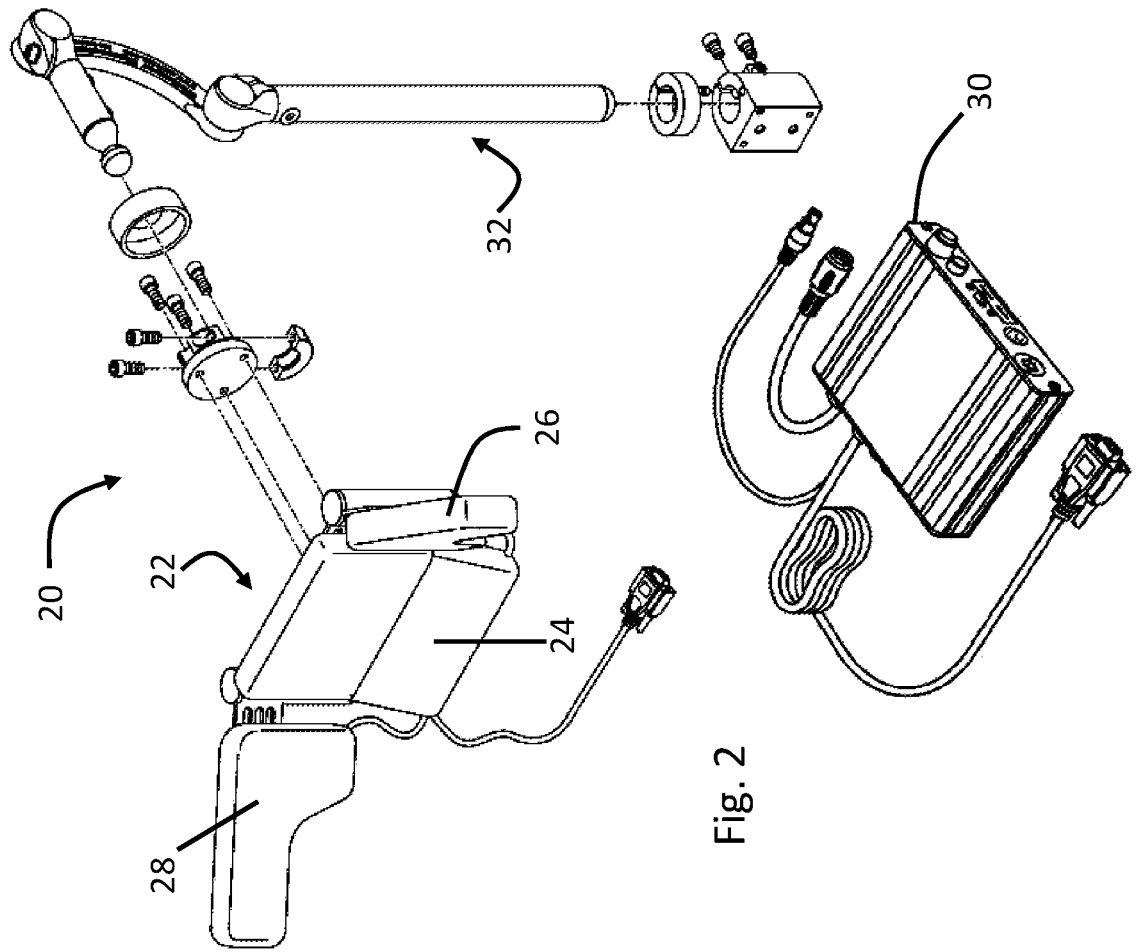
FIG. 2 is an exploded perspective view of an embodiment of a head array assembly and controller of the power wheelchair of FIG. 1.
Figure 1:
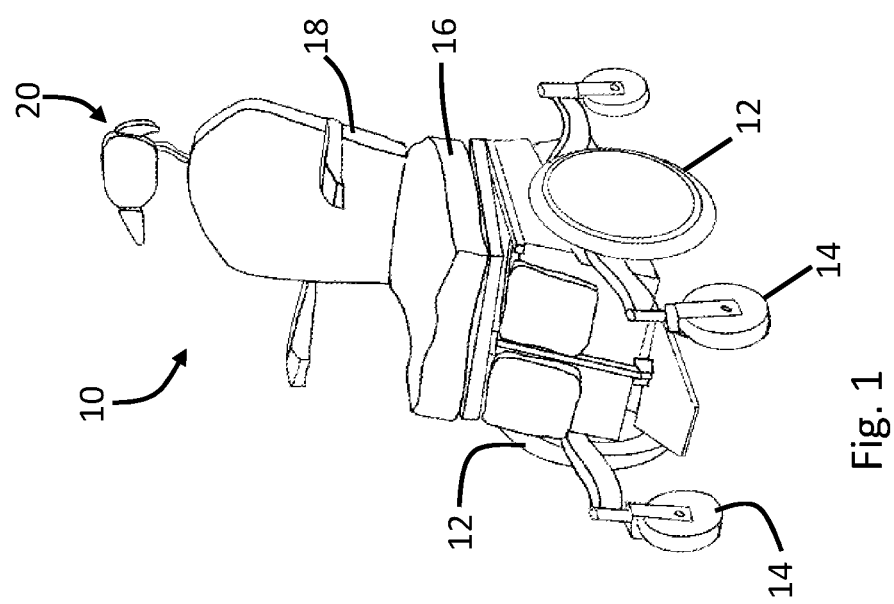
FIG. 1 is a perspective view of a power wheelchair in accordance with the invention.

Referring now to the drawings, there is illustrated in FIG. 1 a power driven wheelchair, shown generally at 10. The exemplary power wheelchair is illustrated as a mid-wheel drive wheelchair, however, it should be understood that the power driven wheelchair 10 may be of a front wheel drive configuration, rear wheel drive configuration, or other suitable drive configuration. The wheelchair 10 includes drive wheels 12 and stabilizing caster wheels 14 as are well known in the art. The wheelchair 10 further includes a seat 16 and backrest 18. The backrest 18 supports a head array assembly, shown generally at 20, as shown in detail in FIG. 2. The head array assembly 20 includes a headrest assembly, shown generally at 22, having a center pad 24, and left and right side pads 26 and 28, respectively. The left and right side pads 26 and 28 are adjustably hinged from the sides of the center pad 24 and configured to be accessible by the user's temple region. In one embodiment, each of the left, center, and right pads of the headrest assembly 22 include at least one sensor configured to receive an input signal from a user and output an operating command signal to a controller 30. In another embodiment, the left and right pads include sensors that send operating command signals to the controller 30.

As will be explained in detail, the sensor may be configured as a force or pressure sensor providing an output that that is proportional to and responsive to a force applied thereto. The sensor may also be configured as a capacitive sensor providing an output indicative of and responsive to the proximate position of a user's body portion to the sensor. The sensor may also be two or more sensors responsive to force and position. It should be understood that the head array is an exemplary embodiment. Other cushion structures and drive control input configurations can be used. For example, in one embodiment, the seat back and armrests can be configured to function in a similar manner to the center pad and side pad operation described below in detail. Alternatively, the senor arrangement may be used in conjunction with a conventional joystick or in the form of an elbow drive device, knee drive device, and the like. In the illustrated embodiment, the headrest assembly 22 may be supported by an angle adjustable and linearly extendable support post system 32. Alternatively, the headrest assembly 22 may be supported by any suitable mounting arrangement such as a rod extending from an upper surface of the backrest 18.

Referring now to FIGS. 3 and 4, there is illustrated an alternative embodiment of a head array assembly, shown generally at 34. The head array assembly 34, when considered as a control device, is functionally similar to head array assembly 20 with respect to function and sensor types. The head array assembly 20 may have sensors in the left and right pads 26 and 28. Thus, left and right turns of the wheelchair 10 are may by applying greater pressure to pad situated toward the desired turn direction. Forward motion of the wheelchair 10 is obtained by pressure applied to both left and right pads 26 and 28. The head array assembly 34 includes sensors in all three pads and additional adjustment capability to position side pads relative to the user's head. The head array 34 includes a center pad, shown generally at 36 and left and right side pads 38 and 40, respectively. The center pad 36, and left and right side pads 38 and 40 are mounted to a support frame 42 that connects to a pivot mount 44. The pivot mount 44 is also shown as part of the support post system 32. The left and right side pads 38 and 40 are pivotally supported by axially adjustable rods 46 that couple to the support frame by rod swivel mounts 48.

Figure 5:
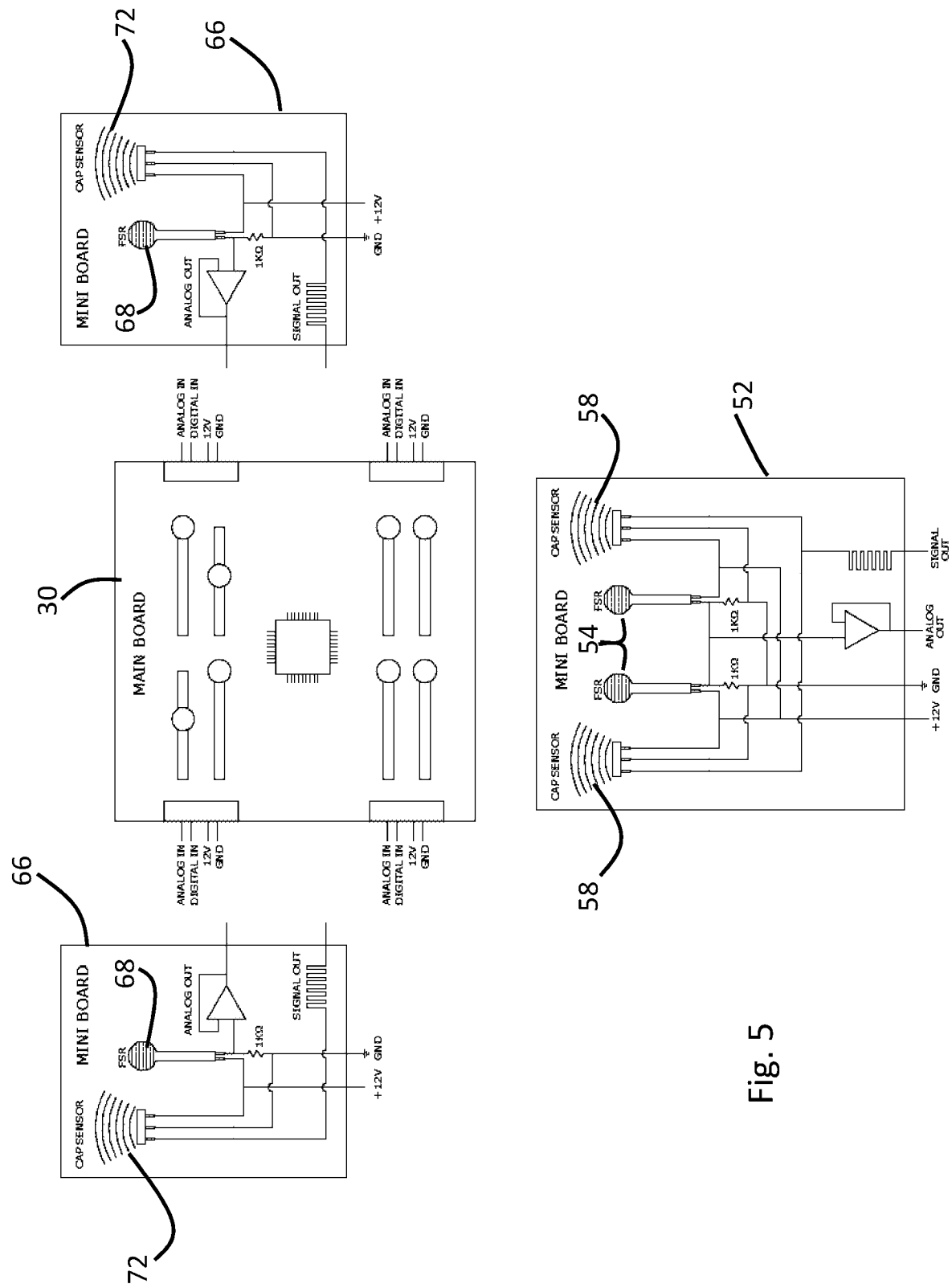
FIG. 5 is a schematic illustration of the head array sensor and controller components in accordance with the invention.

As shown in FIG. 4, the center pad 36 includes rear shell 50 configured to contain and support a circuit board 52, at least one force sensor 54, a cushion 56, at least one capacitive sensor 58, and a covering material 60. The circuit board 52 provides electrical and communication connectivity between the sensors 54 and 58 and the controller 30. The force sensor 54 is configured as a variable resistance device that changes resistance and provides a signal output that is in proportion, or in an inverse proportion, to the magnitude of the force applied to the sensor 54. One example of such a force sensor is an FSR400-series sensor produced by Interlink Electronics, though other proportional force sensors may be used if desired. As a user's head presses against the center pad 36, a force is transmitted to the force sensor 54. An output signal indicative of the force and proportional to changes in the applied force (increases or decreases in force magnitude) is generated and sent to the controller 30. In one particular embodiment, as the force is applied to the force sensor 54, the resistance of the sensor decreases. This force sensor output signal provides a first command signal, such as a speed signal, to the controller 30. In one embodiment, the force sensor 54 is a pair of force sensors 54, as shown in FIG. 5 though any suitable number of sensors may be used.

The capacitive sensor 58 is positioned on one side of the cushion 56 (proximate to a user's head) and the force sensor 54 is positioned on the other side of the cushion 56. The capacitive sensor 58 provides an output signal indicative of the proximity of the user's head relative to the center cushion 36. In one embodiment, the capacitive sensor 58 acts as an on/off switch device. An example of such a capacitive sensor is capacitive sensor model no. CBN10-F46-E2, produced by Pepperl and Fuchs. In one embodiment of a control strategy used by the controller 30 and a control algorithm, the capacitive sensor 58 provides a signal that is used to calibrate or null output of the force sensor 54 based on the user's head position in the head array 34, as is shown in the programming flow charts of FIGS. 7 and 8. In another embodiment, the capacitive sensor 58 functions to reproduce the familiar step function operation of a sip-and-puff type of input device, as will be explained below. The center pad 36 is covered with the covering material 60 to provide user comfort, protect the user against skin abrasions, and provide an aesthetic appearance.

The side pads 38 and 40 will be described in conjunction with the right side pad 40, though the side pads are the same for each side. The side pad 40 includes a mounting plate 62 that supports a split collar 64 to adjustably mount the side pad 40 to swivel balls at the ends of the rods 46. A circuit board 66 is supported by the mounting plate 62 and may include a force sensor 68. The force sensor 68 is similar in function and operation to force sensor 54 of the center pad 36. A cushion 70, such as a foam pad, is placed against and covering the force sensor 68. A capacitive sensor 72 is supported on the opposite side of the cushion 70 and the assembly is covered with a covering material 74. An electrical line 76 conveys the signals produced by the force sensor 68 and the capacitive sensor 72 to the controller 30. The side pad 40 functions in a similar manner to the center pad 36. As a user presses his right temple, for example, against the pad the force sensor 68 measures the force and send a signal to the controller that is proportional to the force applied. Side pad 38 provides a second signal indicative of a turning command, such as a left turn command. Side pad 40 provides a third signal indicative of a turning command, such as a right turn command. Thus in one embodiment, as the user presses his head against the right side pad 40 with increasing pressure, the controller 30 causes the wheelchair to turn right with an increasing turning rate. This analog-type output provides the same response in the wheelchair as moving a joystick to increasing positions toward the right causes an increased right-hand turning rate.

Figure 6:
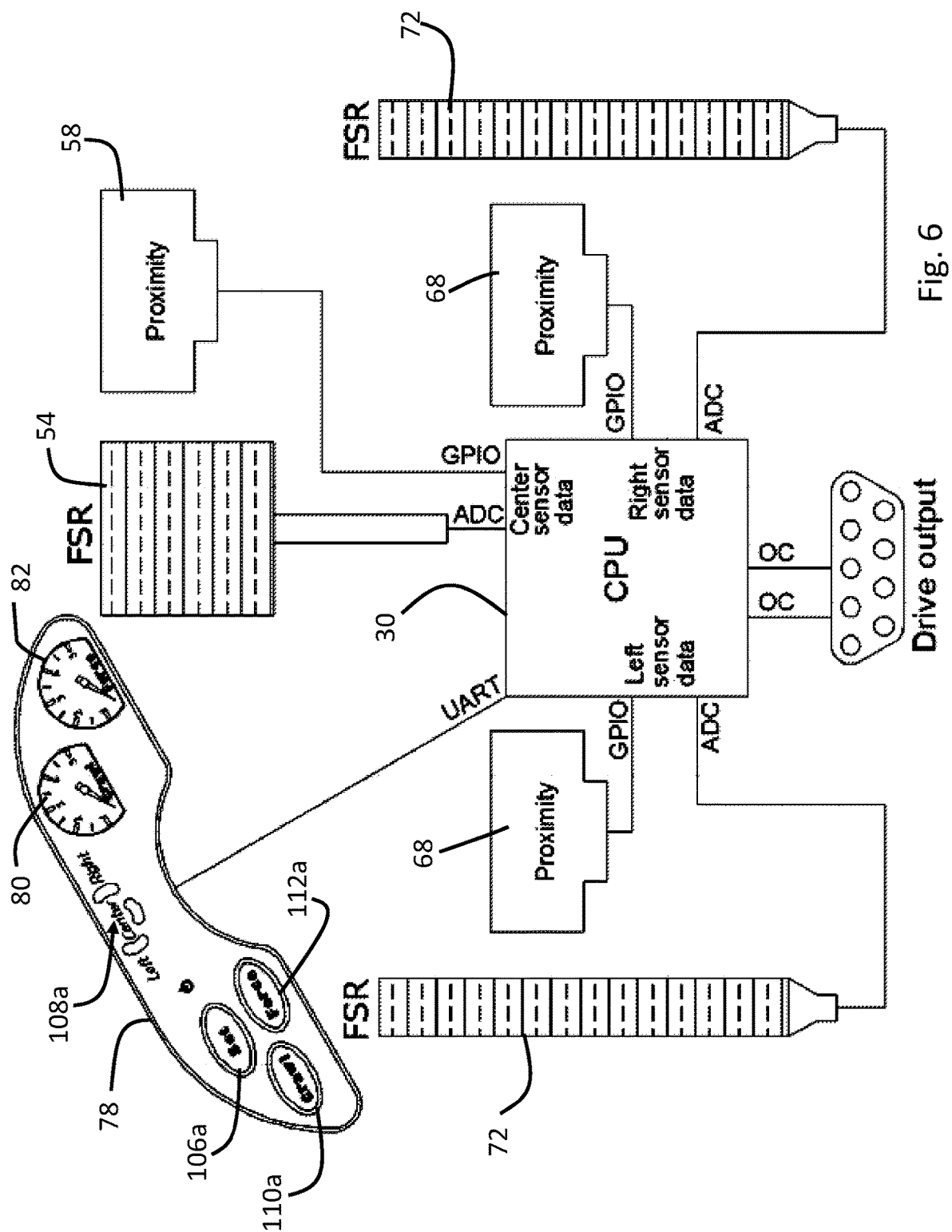
FIG. 6 is a schematic illustration drive control system with a programming input device in accordance with the invention.

In an alternative embodiment, the center, left, and right pads 36, 38, and 40 may operate based on the capacitive sensor 58 of the center pad 36 and capacitive sensors 72 in each of the left and right side pads 38 and 40. In such an operating mode, the capacitive sensors 58 and 72 act as on/off switches to provide operations of turning and driving functions of the wheelchair at preselected speeds, similar to the step inputs of sip-and-puff devices. As shown in FIG. 6, a programming input device 78, such as for example a pendant, computer, joystick, or dongle, may be used to program the controller 30. The pendant 78 provides the ability to input discrete speed range settings 80, for example five speed ranges 1-5, that set operating speeds from slow (1) to full speed capability (5) in discrete step functions of increasing speed capability. Additionally, the pendant 78 may be able to adjust the force detection or response sensitivity by a force parameter 82. This adjustment may also be able to tune the force parameter in a temporal condition to account for spasms that may be inadvertently inputted by the user. When the capacitive sensor 58 detects a user, the wheelchair operates in a forward direction at the preprogrammed speed associated with the center pad 36. Similarly, when the user moves his head to activate capacitive sensor 72, the wheelchair will turn at the preprogrammed speed associated with either the left pad 38 or right pad 40.

In yet another embodiment of the drive control system, the operation of the force sensor is overlaid on the operation of the capacitor sensor, as will be explained in conjunction with operation of the center pad 36 for forward or reverse control. In this control strategy, the capacitive sensor 58 detects the presence or absence of the user's head and functions as an on/off switch. The output of the capacitor sensor 58 invokes the preprogrammed speed range (1 through 5) in the controller 30. Detection of the user initiates forward (or backward) movement of the wheelchair 10 at the programmed speed range. The user then actuates the force sensor 54 by pressing into the center pad 36. This force signal actuates the controller 30 to increase the speed of the wheelchair 10 in accordance with the force level detected by the force sensor 54. In one embodiment, the coupled operation using capacitive and force sensor inputs varies the speed in conjunction with a transfer function 200 represented in FIG. 9.

In this configuration, the drive control system can be customized to accommodate users having either reasonable neck muscle usage or asymmetric coordination or muscle control. For example, where a user has good, symmetrical neck muscle coordination and control, the system may be configured such that the capacitive sensor 58 initiates the lowest speed range setting. The force sensor 54 responds to the user's pressure input to ramps the speed up or down according to the transfer function 200. The side pads 38 and 40 may be programmed to respond in the same manner. Thus, the system operation mimics the operational characteristics of a joystick input device. In situations where the user exhibits asymmetrical muscle control, for example having more ability to move his head to the left rather than the right, the system may be customized where the left side pad 38 is programmed with more reliance on speed control from the force sensor 54 and using a slow speed setting triggered by the capacitive sensor 58. The right side pad 40, where the user has less capability to actuate pressure based speed increases, may be programmed with a higher speed range triggered by the capacitive sensor 58. The wheelchair 10 would turn right more in line with the familiar functions of a step input device yet still respond to whatever pressure signal the user may be able to provide.

Referring now to FIG. 5, there is illustrated schematically an embodiment of the head array assembly 34 where the center pad 36 supports two force sensors 54 and two capacitive sensors 58. These sensors are supported, at least electrically, by the circuit board 52 and may have common outputs as shown or separate outputs such that the controller 30 provides a blended or combined force signal and a separate blended or combined capacitive proximity signal.

Figure 7:
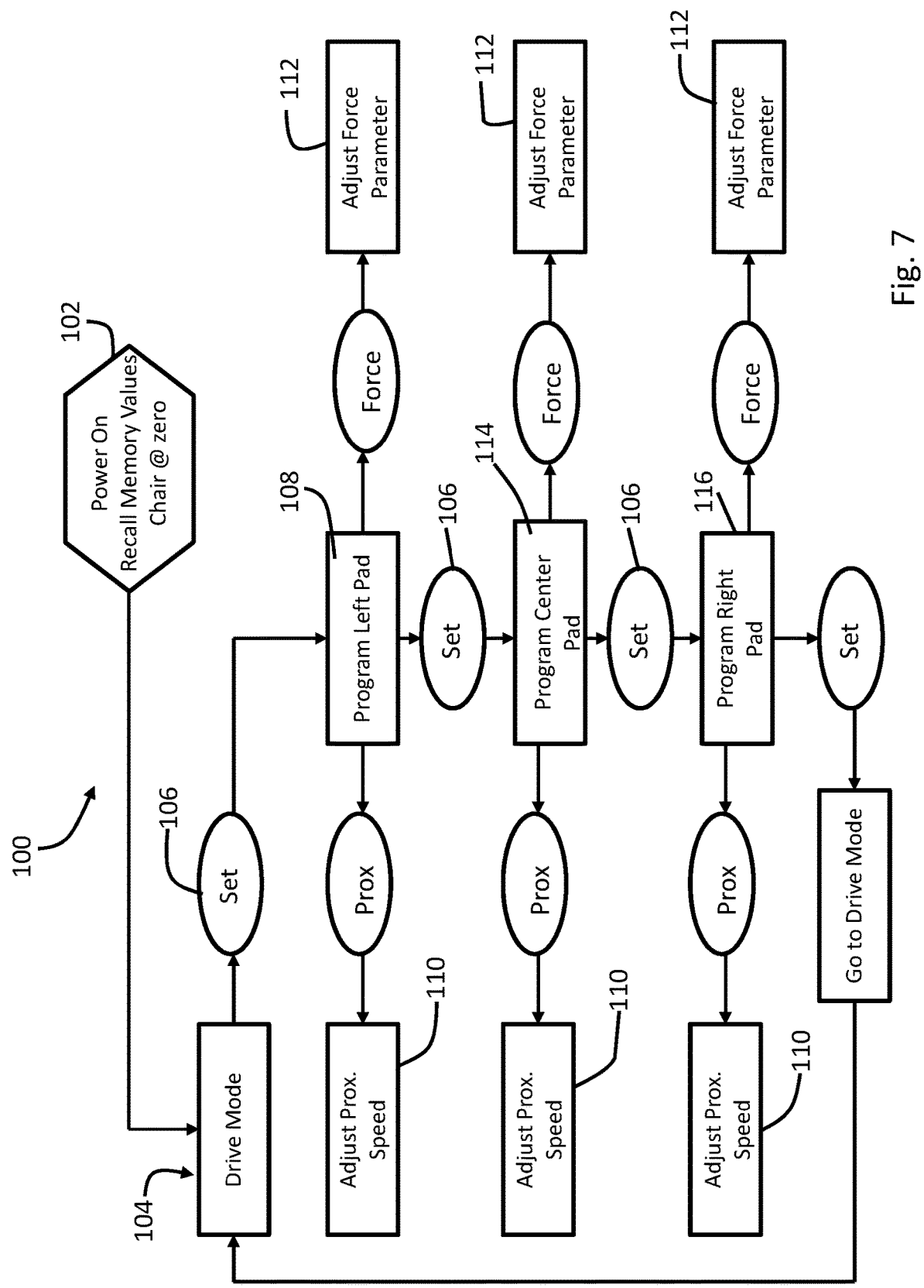
FIG. 7 is a flow chart illustrating initialization steps of a software algorithm that controls the various embodiments of the sensor cushion pad in accordance with the invention.
Figure 8:
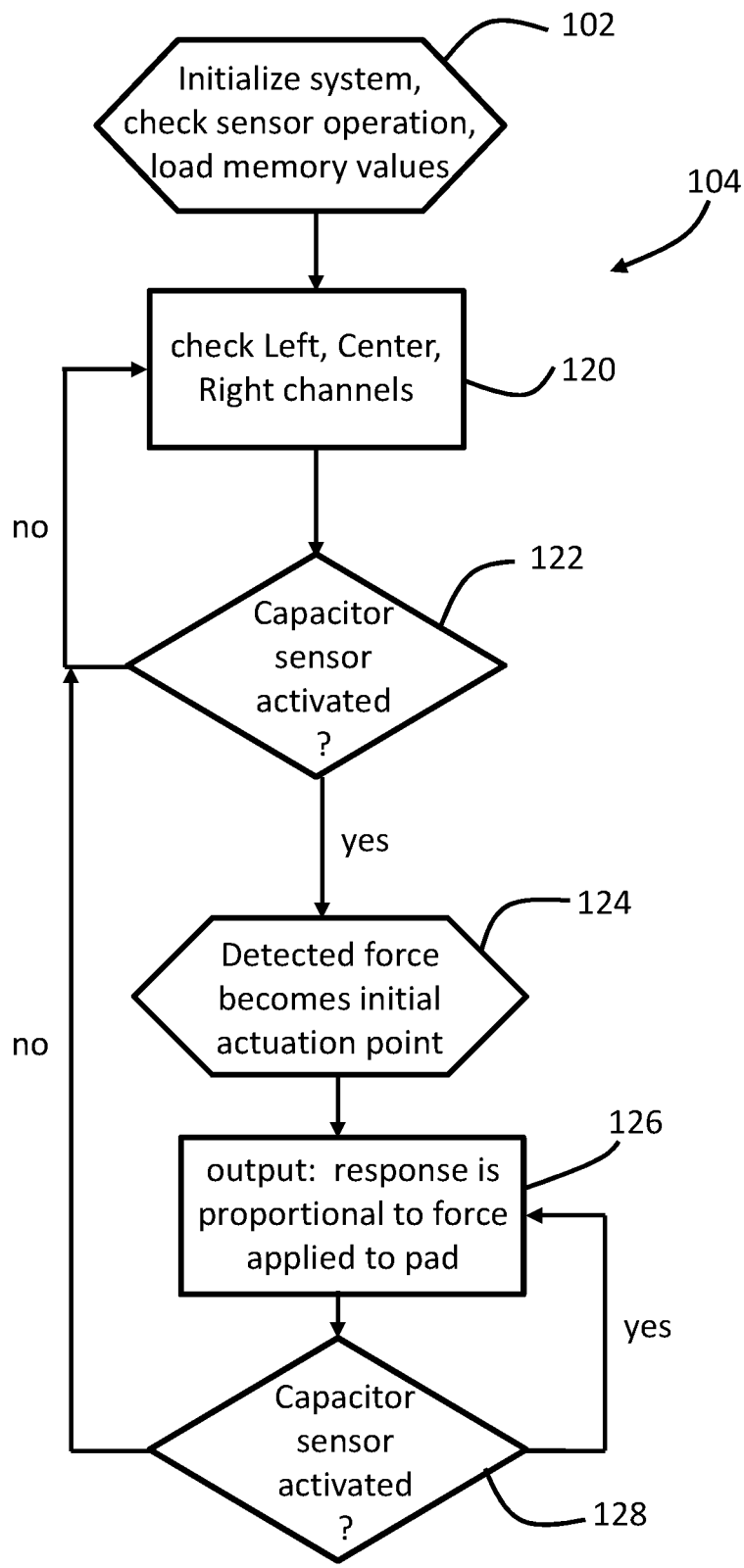
FIG. 8 is a flow chart illustrating a software algorithm for a nullification (zeroing) sequence of a force sensor portion of the sensing cushion pad in accordance with the invention

Referring now to FIGS. 7 and 8, the programming flow charts illustrate the steps of initializing and adjusting the pad sensitivities of the system during a start up operation (FIG. 7) and system function during the "drive mode" operating environment (FIG. 8). As shown in FIG. 7, the startup sequence 100 begins at step 102 when the system is initially powered. Preset parameters stored in the memory of the controller 30 are recalled and the system is initialized with a zero speed and turn input. The drive mode 104 is entered. The drive mode 104 is shown in detail in FIG. 8. The drive mode 104 may be exited by a "set" step 106. The set step 106 is entered by the operating programming pendant 78 and activating the set button 106a. Once activated, each of the pads and related sensors may be programmed and adjusted for a user's specific needs. The sensor programming order is merely illustrative and may be conducted in any sequence desired. In a first pad programming step 108, a left pad programming button 108a is activated permitting the ability to adjust the capacitive and force sensor parameters, as described above. For example, an attendant may program the speed range activated by the capacitive sensor 72 by stepping through entries with a speed or "crawl" button 110a at prox. speed step 110. Then, a force parameter input step 112 may be entered by activating a force button 112a. In one embodiment, the force parameter may be related to the sensitivity of the force sensor or the resistance range associated with the force sensor. Other parameters associated with the force sensor may be varied during this step, if desired. In one embodiment, the inputted values may be stored by activating the set button 106a. Similar programming may be conducted for a center pad programming step 114 and a right pad programming step 116. Once the parameters have been saved, the drive mode 104 may be reentered.

As shown in FIG. 8, within the drive mode 104 the system performs a check of each capacitive proximity sensor and force sensor at step 120. The drive mode 104 portion of the algorithm then check if one of the capacitive sensors has been activated at step 122. In one embodiment, the algorithm may iterate between steps 120 and 122 until all sensors have been checked. When a capacitive sensors is determined to be active, a null point or threshold value for the force sensor is created based on the force sensor reading at that instant. The force sensor output is scaled from the null setting such that the initially read force becomes zero and additional pressure applied initiates movement from this new zero point at step 126. The algorithm then iterates between verifying that the capacitive sensor is still active at step 128 and, if so, maintains the null values and provides the force sensor outputs in proportion to the pressure input from the user. If the capacitive sensor output is not detected, the step 128 proceeds back to step 120 and begins the sensor check again.

Figure 9:
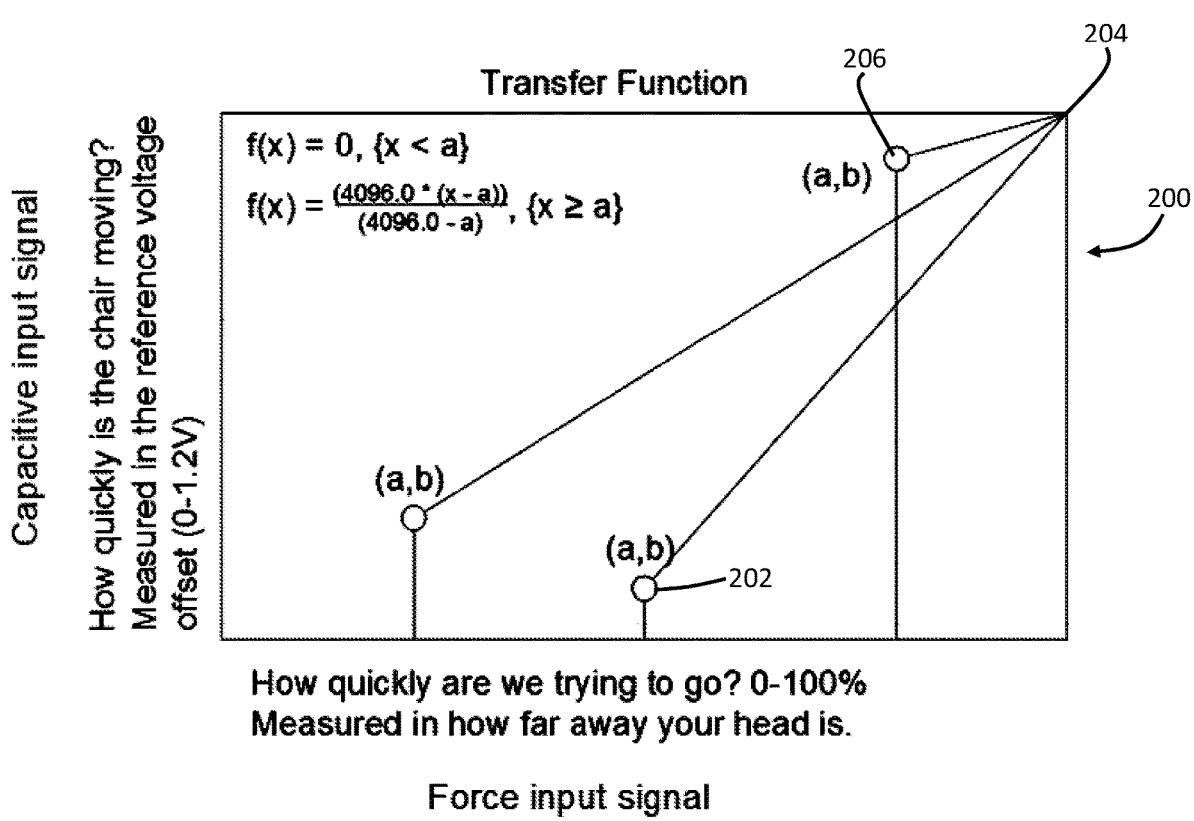
FIG. 9 is a graph of a transfer function of the algorithm for controlling the various embodiments of the sensor cushion pad in accordance with the invention.

Referring now to FIG. 9, the transfer function 200 associates the various speed ranges triggered by the capacitive sensors and the speed rate increases controlled by the force sensors. For example, a slow initial speed range, shown generally at 202, may be ramped at a rate that accounts for a user's ability to apply a desired varying force on the control pad to reach a chair set speed limit 204. The speed point 202 may be the set point for the center pad 36, for example. This would give the user slow initial speed and provide a wide range of speed control based on force input. Alternatively, the set point may be a fast speed range setting 206 and require little force input should a user not have sufficient muscular control.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A powered wheelchair drive control system comprising:
   a head array having a left pad, a right pad, and a center pad, each pad having a force sensor proportionally responsive to an applied force from a user's head against the at least one of the left pad, right pad, or the center pad and a capacitive sensor responsive to the proximity of a user's head relative to at least one of the left pad, the right pad, or the center pad, wherein the capacitive sensor provides an active state signal in response to the presence of the user's head and an off state signal in the absence of the user's head;
   a controller configured to operate a wheelchair drive motor in response to signals generated by the force sensor and capacitive sensor activated by a user's head, and the controller programmed with instructions to operate a wheelchair drive motor at a predetermined speed level in response to the active state signal of the capacitive sensor in the center pad to activate the predetermined speed level in one of a forward and a reverse direction and to activate the force sensor to generate a proportional speed signal in the one of the forward and reverse directions outside of the predetermined speed level, the controller further configured to prevent the proportional speed signal of the force sensor from operating the wheelchair drive motor in response to the off state signal.

2. The powered wheelchair drive control system of claim 1 wherein the controller responds to forces applied to the left or right force sensors such that a turning speed in proportion to the left or right force output signals is commanded to create an associated turning direction.

3. The powered wheelchair drive control system of claim 1 wherein the capacitive sensor is configured to generate a null value corresponding to an initial output signal of the force sensor during a start up operation of the controller and the capacitive sensor generating an active state signal.

4. The powered wheelchair drive control system of claim 1 wherein the controller responds to the capacitive sensor in the left pad to activate a left turn direction and a predetermined left rate of turn and responds to the capacitive sensor in the right pad to activate a right turn direction and predetermined right rate of turn.

5. The powered wheelchair drive control system of claim 4 wherein the controller is programmed with the predetermined forward speed range and the predetermined left rate of turn and the predetermined right rate of turn, the controller further programmed to adjust a force parameter associated with the force sensor.

6. The powered wheelchair drive control system of claim 4 wherein the controller is programmed to capture an output value of one of the left, right, and center force sensors in response to an initial active state signal from the corresponding left, right, and center capacitive sensor and equating the output value to a threshold value such that the controller responds to force output signals from the one of the left, right and center force sensors that is above the threshold value.

7. The powered wheelchair drive control system of claim 5 wherein the controller includes an algorithm having a transfer function that limits the proportional output of the respective force sensors to a range between one of the predetermined forward speed range, the predetermined left rate of turn and the predetermined right rate of turn and a corresponding respective maximum forward speed, maximum left rate of turn, and a maximum right rate of turn.

8. The powered wheelchair drive control system of claim 1 wherein the head array and controller are operatively connected to one of a front wheel drive wheelchair, a rear wheel drive wheelchair, or a mid-wheel drive wheelchair.

9. The powered wheelchair drive control system of claim 1 wherein the controller is programmed with a transfer function to control an acceleration level with the force sensor signal.

10. The powered wheelchair drive control system of claim 1 wherein the off state is an inactive state signal configured to prevent operation of the wheelchair drive motors, the controller is programmed with multiple predetermined speed levels and is responsive to successive time-based activations of the center pad capacitive sensor to operate the wheelchair drive motors at a selected one of the multiple predetermined speed levels.

11. The powered wheelchair drive control system of claim 1 wherein the right pad capacitive sensor activates a right turn predetermined turn rate and the right pad force sensor increases a right turn speed and the left pad capacitive sensor activates a left turn predetermined turn rate and the left pad force sensor increases a left turn speed.

12. The powered wheelchair drive control system of claim 1 wherein the off state signal is an inactive state signal and the controller is programmed to prevent the preprogrammed speed level from operating the wheelchair drive motor in response to the inactive state signal.

13. A powered wheelchair drive control system comprising:
   a head array having a center pad, a left pad and a right pad, each pad having a force sensor proportionally responsive to an applied force from a user's head against each respective pad and a capacitive sensor responsive to the proximity of a user's head relative to the each respective pad, the capacitive sensor providing an active state signal in response to the presence of the user's head and an off state signal in the absence of the user's head and wherein the center pad active state signal activates a predetermined speed range and enables operation of the center pad force sensor, the center pad force sensor generates a proportional speed signal in the one of the forward and reverse directions within the predetermined speed range;
   the left pad and right pad capacitive sensors providing the active state signals that activate a respective left turn predetermined turn rate and right turn predetermined turn rate and enable operation of the respective left pad and right pad force sensors; and
   a controller programmed with instructions to operate a left and a right wheelchair drive motor in response to signals generated by one of the force sensor or the capacitive sensor of the left pad generating a left turn command signal or the right pad generating a right turn command signal to operate the left wheelchair drive motor and/or the right wheelchair drive motor in response to the one of the left or right turn command signals.

14. The powered wheelchair drive control system of claim 13 wherein the left or right turn command signal of the force sensor of the respective left pad or the right pad provides an increase or decrease of the respective left turn predetermined turn rate or right turn predetermined turn rate in response to the applied force.

\* \* \* \* \*